US008673781B2

(12) United States Patent
Oishi et al.

(10) Patent No.: US 8,673,781 B2
(45) Date of Patent: Mar. 18, 2014

(54) PLASMA ETCHING METHOD

(75) Inventors: Akimitsu Oishi, Hyogo (JP); Shoichi Murakami, Hyogo (JP); Masayasu Hatashita, Hyogo (JP)

(73) Assignee: Sumitomo Precision Products Co., Ltd., Hyogo (JP)

( * ) Notice: Subject to any disclaimer, the term of this patent is extended or adjusted under 35 U.S.C. 154(b) by 102 days.

(21) Appl. No.: 13/318,279

(22) PCT Filed: Sep. 6, 2010

(86) PCT No.: PCT/JP2010/065203
§ 371 (c)(1),
(2), (4) Date: Oct. 31, 2011

(87) PCT Pub. No.: WO2011/052296
PCT Pub. Date: May 5, 2011

(65) Prior Publication Data
US 2012/0052688 A1    Mar. 1, 2012

(30) Foreign Application Priority Data

Oct. 27, 2009    (JP) .................................. 2009-246096

(51) Int. Cl.
*H01L 21/302* (2006.01)
(52) U.S. Cl.
USPC ........... 438/689; 438/690; 438/691; 438/692; 216/37; 216/67
(58) Field of Classification Search
USPC ................. 216/37, 67; 438/689–692
See application file for complete search history.

(56) References Cited

U.S. PATENT DOCUMENTS

| | | | | |
|---|---|---|---|---|
| 5,571,374 A | * | 11/1996 | Thero et al. | 438/718 |
| 6,670,278 B2 | * | 12/2003 | Li et al. | 438/710 |
| 7,465,670 B2 | * | 12/2008 | Hirotsu et al. | 438/706 |
| 2001/0008798 A1 | * | 7/2001 | Naito et al. | 438/689 |

FOREIGN PATENT DOCUMENTS

| | | |
|---|---|---|
| JP | 06-169018 | 6/1994 |
| JP | 08-008232 | 1/1996 |
| JP | 10-303185 | 11/1998 |
| JP | 11-162958 | 6/1999 |

(Continued)

OTHER PUBLICATIONS

K. Robb, Solid State Technology, vol. 48, No. 5, (2005), pp. 1-7.*

(Continued)

*Primary Examiner* — Nadine Norton
*Assistant Examiner* — Maki Angadi
(74) *Attorney, Agent, or Firm* — Miller, Matthias & Hull LLP

(57) ABSTRACT

The present invention relates to a plasma etching method with which a wide-gap semiconductor substrate can be etched with high accuracy. An inert gas is supplied into a processing chamber and plasma is generated from the inert gas, a bias potential is applied to a platen on which a wide-gap semiconductor substrate is placed, thereby making ions generated by the generation of plasma from the inert gas incident on the semiconductor substrate on the platen to thereby heat the semiconductor substrate. After the temperature of the semiconductor substrate reaches an etching temperature between 200° C. and 400° C., an etching gas is supplied into the processing chamber and plasma is generated from the etching gas and a bias potential is applied to the platen, thereby etching the semiconductor substrate while maintaining the temperature of the semiconductor substrate at the etching temperature.

16 Claims, 3 Drawing Sheets

(56) References Cited

FOREIGN PATENT DOCUMENTS

| JP | 2001-144075 | 5/2001 |
| JP | 2003-069154 | 3/2003 |
| JP | 2003-273084 | 9/2003 |
| JP | 2005-322811 | 11/2005 |
| JP | 2007-217733 | 8/2007 |
| JP | 2007/234912 | 9/2007 |
| JP | 2008-294210 | 12/2008 |
| JP | 2009-064998 | 3/2009 |
| JP | 2009/188221 | 8/2009 |
| JP | 2009-194194 | 8/2009 |

OTHER PUBLICATIONS

Notification for Reasons for Rejection for corresponding Japanese patent application JP2009-246096, notification dated Oct. 10, 2012.
J.R. Flemish, et al., "Smooth etching of single crystal 6H-SiC in an electron cyclotron resonance plasma reactor", American Institute of Physics, Apr. 25, 1994, vol. 64 No. 17, pp. 2315-2317.
Notification of Reasons for Rejection for related Japanese Patent Application No. JP 2009-246096.
Supplemental European Search Report for related EP Application No. 10826431.8, report dated Jan. 23, 2013.
Kim Han-Ki et al: "Inductively coupled plasma reactive ion etching of ZnO using BCl3-based plasmas", Journal of Vacuum Science & Technology B: Microelectronics Processing and Phenomena, American Vacuum Society, New York, NY, US, vol. 21, No. 3, Jul. 1, 2003, pp. 1273-1277, XP012009924, ISSN: 0734-211X, DOI: 10.1116/1.1575250.
Krotz G et al: "Rapid plasma etching of cubic SiC using NF3/O2 gas mixtures", Materials Science and Engineering B, Elsevier Sequoia, Lausanne, CH, vol. 46, No. 1-3, Apr. 1, 1997, pp. 16-163, XP004085303, ISSN: 0921-5107, DOI: 10.1016/S0921-5107(96)01969-1.
Beheim G M et al: "Control of trenching and surface roughness in deep reactive ion etched 4H and 6H SiC", Silicon Carbide 2006—Materials, Processing and Devices. Symposium (Materials Research Society Symposium Proceedings vol. 911) Materials Research Society, Warrendale, PA, USA, 2006, pp. 329-334, XP002689182, ISBN: 978-1-55899-867-4.

* cited by examiner

PLASMA ETCHING METHOD

FIELD OF THE DISCLOSURE

The present invention relates to a plasma etching method for plasma etching a wide-gap semiconductor substrate.

BACKGROUND OF THE DISCLOSURE

In the field of semiconductor, conventionally, the silicon substrate (Si substrate) has been widely used as substrate material. However, in recent years, the wide-gap semiconductor substrate which is superior to the silicon substrate in physical properties has been noted. The wide-gap semiconductor substrate generally has a feature that, as compared with silicon and gallium arsenide (GaAs), the crystal lattice constant thereof is smaller and the band gap thereof is larger, and is made including at least one of silicon carbide (SiC), gallium nitride (GaN), aluminum nitride (AlN), zinc oxide (ZnO), boron (B) such as boron nitride (BN) and boron phosphide (BP), carbon (C), nitrogen (N) and oxygen (O).

The wide-gap semiconductor substrate, on the one hand, has a small crystal lattice constant, that is, a strong interatomic bond, and therefore has good physical properties, and, on the other hand, has a disadvantage that it is difficult to be etched because of its strong interatomic bond. Therefore, as a method of plasma etching the semiconductor substrate, for example, a plasma etching method for silicon carbide substrate disclosed in the Japanese Unexamined Patent Application Publication No. 2008-294210 has conventionally been suggested.

In this plasma etching method, a mask forming step of forming a silicon dioxide film ($SiO_2$ film) having a mask pattern of a predetermined shape on a surface of a silicon carbide substrate, a first etching step of plasma etching the silicon carbide substrate using a gas mixture of $SF_6$ gas, $O_2$ gas and Ar gas as etching gas and using the silicon dioxide film as mask, and a second etching step of plasma etching the silicon carbide substrate using a gas mixture of Ar gas and $O_2$ gas as etching gas and using the silicon dioxide film as mask are executed in sequence. In the first etching step, the ratio of the $SF_6$ gas to the $O_2$ gas to the Ar gas is set to a predetermined ratio, the ambient pressure is set to be equal to or lower than 0.5 Pa, and the silicon carbide substrate is heated to a temperature between 70° C. and 100° C. In the second etching step, the ratio of the Ar gas to the $O_2$ gas is set to a predetermined ratio, the ambient pressure is set to be equal to or lower than 0.5 Pa, and the silicon carbide substrate is heated to a temperature between 70° C. and 100° C.

CITATION LIST

Patent Literature

Patent document 1: Japanese Unexamined Patent Application Publication No. 2008-294210

SUMMARY OF THE DISCLOSURE

By the way, when, for example, a silicon (Si) substrate is plasma etched, the temperature of the substrate is usually limited up to 100° C. This is because, once the temperature of the substrate exceeds 100° C., problems occur that the etching shape is deteriorated (it is difficult to perform anisotropic etching) because the etching proceeds isotropically and a passivation film is difficult to be formed, and that, because the heat resistance of a resist film which serves as a mask is low, the resist film is softened and the shape accuracy of the mask pattern is thereby reduced. Further, also when a silicon dioxide ($SiO_2$) substrate is plasma etched, similarly to that described above, because of the problem that the heat resistance of the resist film serving as a mask is low, the temperature to which the substrate is heated is generally limited up to 100° C.

In the aforementioned conventional plasma etching method, the silicon carbide substrate is heated to a temperature between 70° C. and 100° C. for etching and the temperature is controlled up to 100° C. similarly to the above-mentioned silicon substrate and silicon dioxide substrate.

However, as a result of a constant hard study, the inventors of the application found that, in a case where a substrate to be plasma etched was a wide-gap semiconductor substrate having a strong interatomic bond, heating the semiconductor substrate to a temperature above 100° C. for etching improved the etching accuracy.

The present invention has been achieved as a result of the inventors' repeated experiments on the temperature to which the wide-gap semiconductor substrate is heated, at which it is possible to accurately plasma etch the wide-gap semiconductor substrate, and an object thereof is to provide a plasma etching method with which a wide-gap semiconductor substrate can be etched with high accuracy.

The present invention, for achieving the above-described object, relates to a plasma etching method for, by means of an etching apparatus having a processing chamber with a closed space, a platen on which a wide-gap semiconductor substrate is placed, an exhaust device for reducing the pressure in the processing chamber, a gas supply device for supplying a gas into the processing chamber, a plasma generating device having an annular coil and generating plasma from the gas supplied into the processing chamber by supplying RF power to the coil, and an RF power supply unit for supplying RF power to the platen, plasma etching the wide-gap semiconductor substrate on the platen, the plasma etching method characterized in that after the wide-gap semiconductor substrate is placed on the platen, an etching gas is supplied by the gas supply device into the processing chamber the pressure in which has been reduced by the exhaust device and plasma is generated from the supplied etching gas by the plasma generating device, and a bias potential is applied to the platen by the RF power supply unit, thereby etching the wide-gap semiconductor substrate, and the wide-gap semiconductor substrate is etched in a state of having been heated to a temperature between 200° C. and 400° C.

According to the invention, when a wide-gap semiconductor substrate (hereinafter, merely referred to as a "semiconductor substrate") is plasma etched, the semiconductor substrate is heated to a temperature between 200° C. and 400° C. The reason for this is that, as a result of the inventors' study, it was found that, when a semiconductor substrate having a strong interatomic bond is etched by means of the above-described etching apparatus, it is preferable that the temperature to which the semiconductor substrate is heated is a temperature between 200° C. and 400° C.

That is, according to the inventors' study, when the temperature to which a semiconductor substrate K is heated is low, as shown in FIG. 2(a), a sub-trench H' is additionally formed at the side wall side of the bottom of a hole H or trench H which is formed by etching and it is therefore not possible to obtain an accurate etching shape. However, as the temperature to which the semiconductor substrate K is heated becomes gradually higher, as shown in FIG. 2(b), the formed sub-trench H' becomes gradually smaller, and finally, as shown in FIG. 2(c), the sub-trench H' is not formed.

Further, as the temperature to which the semiconductor substrate K is heated becomes gradually higher from the temperature at which the sub-trench H' is not formed, the etching becomes apt to proceed isotropically, and, as shown in FIGS. 2(d) and 2(e), the side wall of the hole H or trench H is also etched. The atoms forming the semiconductor substrate K do not react with radicals and ions generated by generating plasma from an etching gas until the bonds between the atoms are broken. When the temperature of the semiconductor substrate K is higher, the bonds between the atoms are broken more easily and the atoms forming the semiconductor substrate K more easily react with radicals and ions generated by generating plasma from an etching gas, and therefore the etching caused by this reaction proceeds efficiently. It is noted that, among the above-mentioned materials which can form a semiconductor substrate K, particularly silicon carbide has a strong bond between silicon (Si) and carbon (C), but, when the temperature of the semiconductor substrate K is higher, the bond between them is broken more easily and the semiconductor substrate K can be easily etched. Therefore, as the temperature to which the semiconductor substrate K is heated becomes higher, the wide-gap semiconductor substrate K becomes apt to be etched isotropically and the side wall of the hole H or trench H becomes apt to be etched. It is noted that, comparing FIGS. 2(d) and 2(e), FIG. 2(e) shows an etching shape obtained when the temperature to which the semiconductor substrate K is heated is higher. Further, in FIG. 2, the reference M indicates a mask.

The relationship between the temperature to which the semiconductor substrate was heated and etching shape was examined taking the above-described matters into consideration, and it was verified that, where the temperature to which the semiconductor substrate was heated was a temperature between 200° C. and 400° C., when plasma etching was performed, the sub-trench H' was never formed in the bottom of the hole H or trench H, and, even though the sub-trench H' was formed therein, it was a very small one, and the side wall of the hole H or trench H was never etched, and, even though it was etched, it was etched very slightly. Therefore, heating the semiconductor substrate to a temperature between 200° C. and 400° C. enables the semiconductor substrate to be etched with high accuracy. It is noted that it is more preferable that the temperature to which the semiconductor substrate is heated is a temperature in the range of 300° C. to 400° C.

Thus, according to the plasma etching method of the present invention, it is possible to accurately etch a semiconductor substrate because the semiconductor substrate is heated to a temperature between 200° C. and 400° C. when plasma etching the semiconductor substrate.

By the way, as shown in FIG. 3, it takes a certain time to raise the temperature of a semiconductor substrate from a temperature before heating $T_0$ to a temperature for etching $T_1$ (200° C.$\leq T_1 \leq$400° C.). Further, if an etching gas is supplied into the processing chamber and etching of a semiconductor substrate is started before the temperature of the semiconductor substrate reaches the etching temperature $T_1$, because etching conditions vary due to the change of the temperature of the semiconductor substrate until the temperature of the semiconductor substrate reaches the etching temperature $T_1$ after the start of the etching, problems occur that it is not possible to etch the semiconductor substrate with high accuracy (for example, a sub-trench H' as shown in FIG. 2(a) or FIG. 2(b), which is formed by etching during a time period during which the temperature of the semiconductor substrate is low, cannot be removed completely even by etching after the temperature of the semiconductor substrate reaches the etching temperature $T_1$), and that the etching rate is not uniform.

Therefore, by etching a semiconductor substrate with a plasma generated form an etching gas while maintaining the temperature of the semiconductor substrate at a temperature for etching after the semiconductor substrate is heated in advance until the temperature thereof reaches the temperature for etching, it is possible to prevent the change of the temperature of the semiconductor substrate after the start of the etching and thereby stabilize the etching. Therefore, it is possible to accurately etch the semiconductor substrate and to prevent the etching rate from becoming non-uniform.

It is noted that a configuration is possible in which, when heating the semiconductor substrate to raise the temperature thereof to the temperature for etching, an inert gas is supplied into the processing chamber and plasma is generated from the inert gas, and a bias potential is applied to the platen, thereby making ions which are generated by the generation of plasma from the inert gas incident on the semiconductor substrate to thereby heat the semiconductor substrate. When thus configured, it is possible to raise the temperature of the semiconductor substrate to a predetermined temperature while preventing etching by ion incidence. Further, the semiconductor substrate can be heated only by generating plasma from an inert gas without newly providing heating means for heating the semiconductor substrate.

Further, in order to maintain the temperature of the semiconductor substrate at a constant temperature, it is advantageous that the semiconductor substrate is heated by incidence of ions which are generated by generating plasma from an etching gas.

Besides, when heating the semiconductor substrate, the semiconductor substrate may be heated by a heater or by both ion incidence and a heater. Further, in a case where the temperature of the semiconductor substrate rises too high, cooling of the semiconductor substrate may be incorporated.

It is noted that, as the semiconductor substrate, as described above, there can be given a semiconductor substrate made including at least one of silicon carbide, gallium nitride, aluminum nitride, zinc oxide, boron such as boron nitride and boron phosphide, carbon, nitrogen and oxygen, for example. However, it is not limited thereto.

As described above, according to the plasma etching method of the present invention, setting the temperature to which a semiconductor substrate is heated to a temperature between 200° C. and 400° C. makes it possible to perform a highly accurate plasma etching.

DETAILED DESCRIPTION

Hereinafter, a specific embodiment of the present invention will be described on the basis of the accompanying drawings. It is noted that the embodiment describes, as an example, a case where a silicon carbide substrate K which is one of the wide-gap semiconductor substrate is plasma etched by an etching apparatus 1 shown in FIG. 1. Further, this silicon carbide substrate K has, for example, the crystal structure of 4H—SiC and has, for example, a silicon dioxide film as etching mask formed on the surface thereof, and the silicon dioxide film has a mask pattern of a predetermined shape formed thereon.

Figure 1:
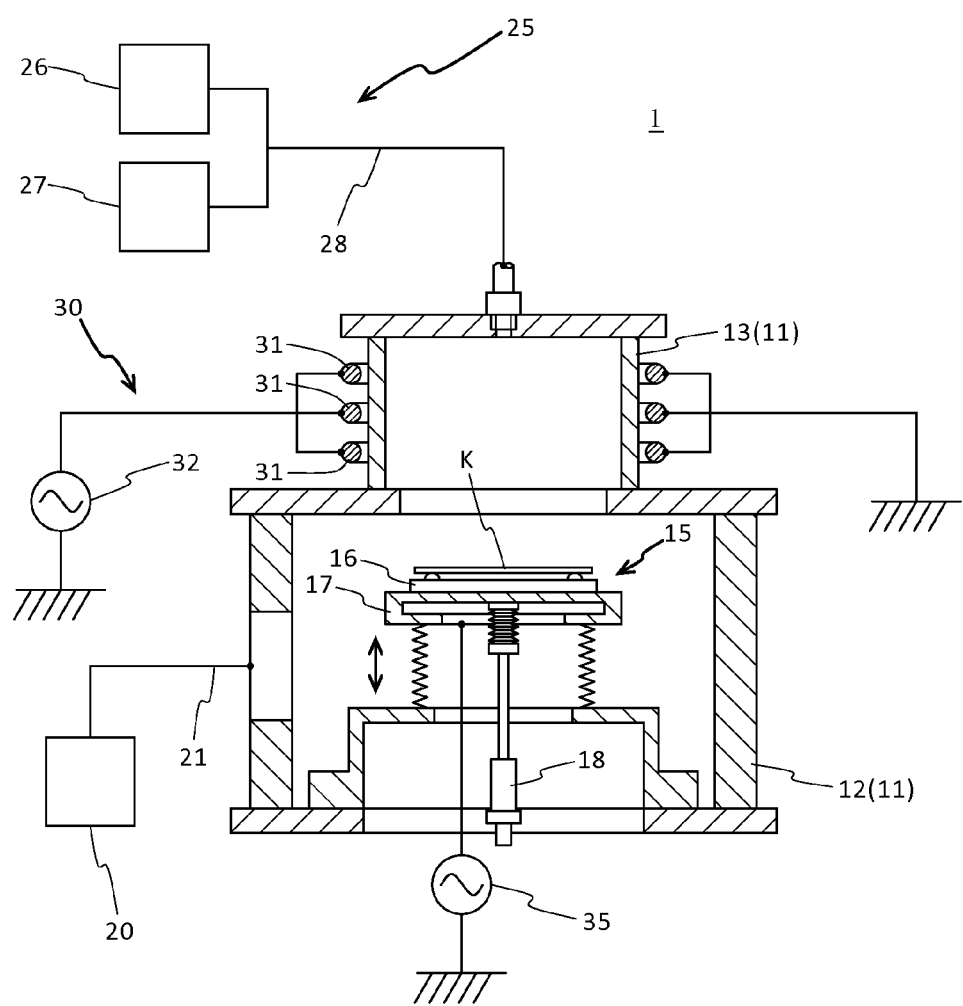
FIG. 1 is a sectional view showing a schematic configuration of an etching apparatus for performing a plasma etching method according to one embodiment of the present invention.

Initially, the etching apparatus 1 will be described. The etching apparatus 1 has, as shown in FIG. 1, a processing chamber 11 having a closed space, a platen 15 which is disposed in the processing chamber 11 in such a manner that it can be freely lifted up and down and on which the silicon carbide substrate K is placed, a lifting cylinder 18 for lifting up and down the platen 15, an exhaust device 20 for reducing the pressure in the processing chamber 11, a gas supply device 25 for supplying an etching gas and an inert gas into the processing chamber 11, a plasma generating device 30 for generating plasma from the etching gas and inert gas supplied into the processing chamber 11, and an RF power supply unit 35 for supplying RF power to the platen 15.

The processing chamber 11 is configured by a lower chamber 12 and an upper chamber 13 each having an inner space, the inner spaces communicating with each other, and the upper chamber 13 is formed to be smaller than the lower chamber 12. The platen 15 is configured by an upper member 16 on which the silicon carbide substrate K is placed and a lower member 17 to which the lifting cylinder 18 is connected, and the platen 15 is disposed in the lower chamber 12.

The exhaust device 20 has an exhaust pipe 21 which is connected to a side surface of the lower chamber 12, and the exhaust device 20 exhausts the gas within the processing chamber 11 through the exhaust pipe 21 to thereby reduce the pressure in the processing chamber 11 to a predetermined pressure.

The gas supply device 25 has an etching gas supply section 26 supplying, for example, $SF_6$ gas or a gas mixture of $SF_6$ gas and $O_2$ gas as etching gas, and an inert gas supply section 27 supplying an inert gas such as He gas, for example, and a supply pipe 28 one end of which is connected to the top surface of the upper chamber 13 and the other end of which is branched and connected to the etching gas supply section 26 and the inert gas supply section 27. An etching gas is supplied into the processing chamber 11 from the etching gas supply section 26 through the supply pipe 28 and an inert gas is supplied into the processing chamber 11 from the inert gas supply section 27 through the supply pipe 28.

The plasma generating device 30 is configured by a plurality of annular coils 31 which are provided on the outer peripheral portion of the upper chamber 13 in such a manner that they are aligned in the vertical direction, and an RF power supply unit 32 for supplying RF power to the coils 31. Plasma is generated from an etching gas and inert gas supplied into the upper chamber 13 by supplying RF power to the coils 31 by means of the RF power supply unit 32. The RF power supply unit 35 supplies RF power to the platen 15 to thereby generate a potential difference (bias potential) between the platen 15 and the plasma, thereby making ions which are generated by generating plasma from the etching gas and the inert gas incident on the silicon carbide substrate K.

Next, a method of plasma etching a silicon carbide substrate K using the etching apparatus 1 configured as described above will be described.

First, the silicon carbide substrate K is loaded into the etching apparatus 1 and placed on the platen 15, and the silicon carbide substrate K is heated until the temperature thereof reaches a temperature between 200° C. and 400° C. for etching (etching temperature). At this time, in the etching apparatus 1, an inert gas is supplied into the processing chamber 11 from the inert gas supply section 27, the pressure in the processing chamber 11 is reduced to a predetermined pressure by the exhaust device 20, and RF power is supplied to the coils 31 and the platen 15 by the RF power supply units 32 and 35, respectively. Plasma is generated from the inert gas supplied into the processing chamber 11 and ions generated by the generation of plasma are made incident on the silicon carbide substrate K and collide therewith due to the bias potential. Thereby, the silicon carbide substrate K is heated, and the temperature thereof rises and is balanced at the etching temperature in due course.

It is noted that whether the temperature of the silicon carbide substrate K reaches the etching temperature can be judged by the heating time of the silicon carbide substrate K or by measurement of temperature, for example. Further, because the silicon dioxide film which is an etching mask has a higher heat resistance than the resist, even though the silicon carbide substrate K is heated to a temperature between 200° C. and 400° C., it is not possible that the silicon dioxide film is softened and the shape accuracy of the mask pattern thereof is therefore reduced.

Once the temperature of the silicon carbide substrate K is balanced at the etching temperature, the silicon carbide substrate K is etched using the silicon dioxide film as mask. At this time, in the etching apparatus 1, an etching gas is supplied into the processing chamber 11 from the etching gas supply section 26, the pressure in the processing chamber 11 is reduced to a predetermined pressure by the exhaust device 20, and RF power is supplied to the coils 31 and the platen 15 by the RF power supply units 32 and 35, respectively. Plasma is generated from the etching gas supplied into the processing chamber 11 and the silicon carbide substrate K is etched by radicals and ions generated by the generation of plasma. Holes and/or trenches corresponding to the mask pattern of the silicon dioxide film are formed in the silicon carbide substrate K.

It is noted that, since, also when the silicon carbide substrate K is etched, the silicon carbide substrate K is heated by ions which are made incident thereon and collide therewith due to the bias potential, the temperature of the silicon carbide substrate K is maintained constant (at the etching temperature).

By the way, as described above, in the embodiment, the silicon carbide substrate K is heated to a temperature between 200° C. and 400° C. for etching. The reason for this is that, as a result of the inventors' study, it was found that, when etching a silicon carbide substrate K having a strong interatomic bond, it is preferable to heat the silicon carbide substrate K to a temperature between 200° C. and 400° C.

Figure 2:
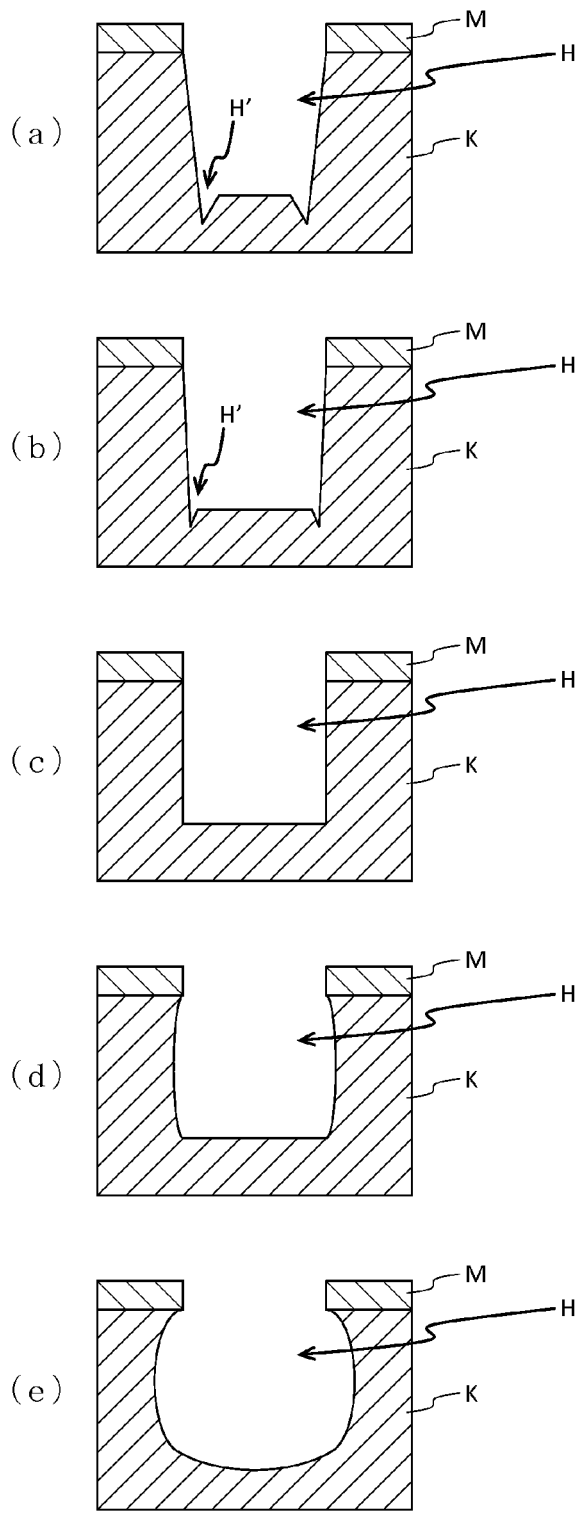
FIG. 2 is a sectional view for explaining the relationship between etching shape of substrate and heating temperature.

That is, according to the inventors' study, when the temperature to which a silicon carbide substrate K is heated is low, as shown in FIG. 2(a), a sub-trench H' is additionally formed at the side wall side of the bottom of a hole H or trench H which is formed by etching and it is therefore not possible to obtain an accurate etching shape. However, as the temperature to which the silicon carbide substrate K is heated is increased gradually, as shown in FIG. 2(b), the formed sub-trench H' becomes gradually smaller, and finally, as shown in FIG. 2(c), the sub-trench H' is not formed.

Further, as the temperature to which the silicon carbide substrate K is heated is increased gradually from the temperature at which the sub-trench H' is not formed, the etching becomes apt to proceed isotropically, and as shown in FIGS. 2(d) and 2(e), the side wall of the hole H or trench H is also etched. Although silicon (Si) and carbon (C) forming the silicon carbide substrate K do not react with radicals and ions generated by generating plasma from an etching gas until the bonds between them are broken, when the temperature of the silicon carbide substrate K is higher, the bonds between the silicon and the carbon are broken more easily and the silicon and the carbon more easily react with radicals and ions generated by generating plasma from an etching gas, and therefore the etching caused by this reaction proceeds efficiently. Therefore, as the temperature to which the silicon carbide substrate K is heated becomes higher, the silicon carbide substrate K becomes apt to be etched isotropically and the side wall of the hole H or trench H becomes apt to be etched.

The relationship between the temperature to which the silicon carbide substrate K was heated and etching shape was examined taking the above-described matters into consideration, and it was verified that, where the temperature to which the silicon carbide substrate K was heated was a temperature between 200° C. and 400° C. (more preferably, between 300° C. and 400° C.), when the silicon carbide substrate K was etched, the sub-trench H' was never formed in the bottom of the hole H or trench H, and, even though the sub-trench H' was formed therein, it was a very small one, and the side wall of the hole H or trench H was never etched, and, even though it was etched, it was etched very slightly. Therefore, heating the silicon carbide substrate K to a temperature between 200° C. and 400° C. (more preferably, between 300° C. and 400° C.) makes it possible to etch the silicon carbide substrate K with high accuracy.

Thus, according to the plasma etching method of the embodiment, it is possible to accurately etch a silicon carbide substrate K because the silicon carbide substrate K is heated to a temperature between 200° C. and 400° C. when plasma etching the silicon carbide substrate K.

Figure 3:
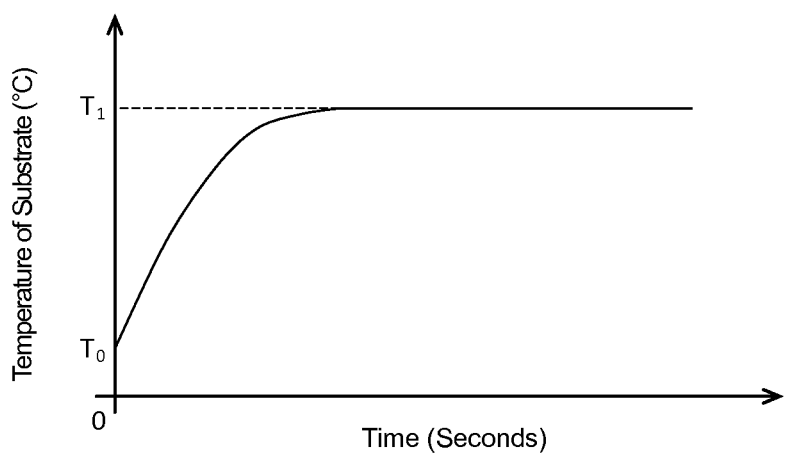
FIG. 3 is a graph showing the relationship between temperature of substrate and heating time.

Further, in the embodiment, the etching is started after the temperature of the silicon carbide substrate K reaches the etching temperature. The reason for this is that, because, as shown in FIG. 3, it takes a certain time to raise the temperature of the silicon carbide substrate K from a temperature before heating $T_0$ to the etching temperature $T_1$ (200° C.≤$T_1$≤400° C.), if the etching of the silicon carbide substrate K is started before the temperature thereof reaches the etching temperature $T_1$, problems occur that, because etching conditions vary due to the change of the temperature of the silicon carbide substrate K until the temperature of the silicon carbide substrate K reaches the etching temperature $T_1$ after the start of the etching, it is not possible to etch the silicon carbide substrate K with high accuracy (for example, a sub-trench H' as shown in FIG. 2(a) or FIG. 2(b), which is formed by etching during a time period during which the temperature of the silicon carbide substrate K is low, cannot be removed completely even by etching after the temperature of the silicon carbide substrate K reaches the etching temperature $T_1$), and that the etching rate is not uniform.

Therefore, by, like this embodiment, starting the etching after the temperature of the silicon carbide substrate K reaches the etching temperature $T_1$, it is possible to prevent the change of the temperature of the silicon carbide substrate K after the start of the etching and thereby stabilize the etching. Therefore, it is possible to accurately etch the silicon carbide substrate K and to prevent the etching rate from becoming non-uniform.

Further, since the silicon carbide substrate K is heated by making ions which are generated by generating plasma from the inert gas incident on the silicon carbide substrate K and collide therewith, it is possible to raise the temperature of the silicon carbide substrate K while preventing etching caused by ion incidence. Further, it is possible to heat the silicon carbide substrate K only by generating plasma from an inert gas without providing a heating mechanism for heating the silicon carbide substrate K on the processing chamber 11.

In this connection, when etching a silicon carbide substrate K having a silicon dioxide film as mask formed on the surface thereof using the plasma etching method of the embodiment, an accurate etching shape as shown in FIG. 2(c) was obtained without a sub-trench H' as shown in FIG. 2(a) or FIG. 2(b) being formed and without the side wall being etched as shown in FIG. 2(d) or FIG. 2(e). It is noted that the processing conditions when heating the silicon carbide substrate K by the generation of plasma from an inert gas and thereby raising the temperature of the silicon carbide substrate K to an etching temperature between 200° C. and 400° C. were that the supply flow rate of He gas as inert gas was 50 sccm, the pressure in the processing chamber 11 was 3 Pa, the RF power to be supplied to the coils 31 was 2.5 kW, and the RF power to be supplied to the platen 15 was 700 W. Further, the processing conditions when etching the silicon carbide substrate K after the temperature thereof reached the etching temperature were that the supply flow rate of $SF_6$ gas as etching gas was 50 sccm, the pressure in the processing chamber 11 was 3 Pa, the RF power to be supplied to the coils 31 was 2.5 kW, and the RF power to be supplied to the platen 15 was 700 W. Further, the etching temperature for the silicon carbide substrate K at this time was about 400° C.

Thus, one embodiment of the present invention has been described. However, a specific embodiment in which the present invention can be implemented is not limited thereto.

Although, in the above embodiment, the temperature of the silicon carbide substrate K is raised by making ions which are generated by generating of plasma from an inert gas incident on the silicon carbide substrate K and collide therewith, the silicon carbide substrate K can be heated by any method. For example, a configuration is possible in which a heater is embedded in the platen 15 and the silicon carbide substrate K is heated by the heater or by both the ion incidence and the heater. Further, in a case where the temperature of the silicon carbide substrate K is raised above 400° C. by heating, it is advantageous to control the temperature of the silicon carbide substrate K in the range of 200° C. to 400° C. in combination with cooling of the silicon carbide substrate K.

Furthermore, although, for the substrate to be etched K, the silicon carbide substrate having the crystal structure of 4H—SiC is given as an example, the substrate to be etched K may be a silicon carbide substrate having a crystal structure other than 4H—SiC, and, besides, may be a compound semiconductor substrate such as gallium nitride, aluminum nitride, zinc oxide, boron nitride and boron phosphide, for example. Further, for the etching mask on the silicon carbide substrate K, instead of the above-mentioned silicon dioxide film, a metal mask such as nickel film can be employed, for example.

Furthermore, although, in the above embodiment, the plasma etching method of the present invention is performed using the etching apparatus 1, an etching apparatus having a different configuration can be used for performing this plasma etching method.

REFERENCE SIGNS LIST

1 Etching apparatus
11 Processing chamber
15 Platen
20 Exhaust device
25 Gas supply device
26 Etching gas supply section
27 Inert gas supply section 30 Plasma generating device
31 Coil
32 RF power supply unit
35 RF power supply unit
K Silicon carbide substrate (wide-gap semiconductor substrate)

What is claimed is:

1. A plasma etching method for, by means of an etching apparatus having a processing chamber with a closed space, a platen on which a wide-gap silicon carbide semiconductor substrate is placed, an exhaust device for reducing the pressure in the processing chamber, a gas supply device for supplying a gas into the processing chamber, a plasma generating device having an annular coil and generating plasma from the gas supplied into the processing chamber by supplying RF power to the coil, and an RF power supply unit for supplying RF power to the platen, plasma etching the wide-gap silicon carbide semiconductor substrate on the platen, the method comprising, after the wide-gap silicon carbide semiconductor substrate is placed on the platen, an etching gas is supplied by the gas supply device into the processing chamber the pressure in which has been reduced by the exhaust device and plasma is generated from the supplied etching gas by the plasma generating device, and a bias potential is applied to the platen by the RF power supply unit, thereby etching the wide-gap silicon carbide semiconductor substrate, and the wide-gap silicon carbide semiconductor substrate is etched in a state of having been heated to a temperature between 200° C. and 400° C.

2. The plasma etching method according to claim 1, in which after the wide-gap silicon carbide semiconductor substrate is heated in advance to a temperature between 200° C. and 400° C., the wide-gap silicon carbide semiconductor substrate is etched while maintaining the temperature.

3. The plasma etching method according to claim 2, in which when the wide gap, silicon carbide semiconductor substrate is heated in advance, an inert gas is supplied into the processing chamber by the gas supply device and plasma is generated from the supplied inert gas by the plasma generating device, and a bias potential is applied to the platen by the RF power supply unit, thereby making ions which are generated by the generation of plasma from the inert gas incident on the wide-gap, silicon carbide semiconductor substrate to thereby heat the wide-gap, silicon carbide semiconductor substrate.

4. The plasma etching method according to claim 3, in which the inert gas comprises He gas.

5. The plasma etching method according to claim 2, in which the wide-gap, silicon carbide semiconductor substrate is heated in advance by a heater embedded in the platen.

6. The plasma etching method according to claim 2, in which, when the wide-gap, silicon carbide semiconductor substrate is heated in advance:

an inert gas is supplied into the processing chamber by the gas supply device and plasma is generated from the supplied inert gas by the plasma generating device, and a bias potential is applied to the platen by the RF power supply unit, thereby making ions which are generated by the generation of plasma from the inert gas incident on the wide-gap, silicon carbide semiconductor substrate to thereby heat the wide-gap, silicon carbide semiconductor substrate; and the wide-gap, silicon carbide semiconductor substrate is heated by a heater embedded in the platen.

7. The plasma etching method according to claim 6, in which the inert gas comprises He gas.

8. The plasma etching method according to claim 1, in which the temperature to which the wide-gap, silicon carbide semiconductor substrate is heated is set in the range of 300° C. to 400° C.

9. The plasma etching method according to claim 1, in which the etching gas comprises $SF_6$ gas.

10. The plasma etching method according to claim 1, in which the etching gas comprises a mixture of $SF_6$ gas and $O_2$ gas.

11. The plasma etching method according to claim 1, in which the wide-gap, silicon carbide semiconductor substrate is etched using a silicon dioxide film as an etching mask.

12. The plasma etching method according to claim 1, in which the wide-gap, silicon carbide semiconductor substrate is etched using a nickel film as an etching mask.

13. The plasma etching method according to claim 1, in which the wide-gap, silicon carbide semiconductor substrate comprises a 4H—SiC substrate.

14. The plasma etching method according to claim 1, in which a hole or trench is formed in the wide-gap, silicon carbide semiconductor substrate by the etching.

15. The plasma etching method according to claim 14, in which a sub-trench is not formed in a bottom of the hole or trench and a side wall of the hole or trench is etched slightly.

16. The plasma etching method according to claim 1, in which:

the wide-gap, silicon carbide semiconductor substrate is heated in advance to a balanced temperature between 200° C. and 400° C.; and after the wide-gap, silicon carbide semiconductor substrate reaches the balanced temperature, the wide-gap, silicon carbide semiconductor substrate is etched while maintaining the balanced temperature.

* * * * *